United States Patent [19]

Fowler

[11] 4,016,560
[45] Apr. 5, 1977

[54] FRACTIONAL BINARY TO DECIMAL CONVERTER

[75] Inventor: Robert W. Fowler, Silver Spring, Md.

[73] Assignee: The United States of America as represented by the Secretary of the Navy, Washington, D.C.

[22] Filed: Mar. 9, 1976

[21] Appl. No.: 665,217

[52] U.S. Cl. .......................... 340/347 DD; 235/155
[51] Int. Cl.² .......................................... G06F 5/00
[58] Field of Search .......................... 235/155, 154; 340/347 DD

[56] References Cited

UNITED STATES PATENTS

| | | | |
|---|---|---|---|
| 3,018,955 | 1/1962 | Mendelson | 235/155 |
| 3,026,034 | 3/1962 | Couleur | 235/155 |
| 3,052,411 | 9/1962 | Boese | 235/155 |
| 3,257,547 | 6/1966 | Bernstein | 235/155 |

Primary Examiner—Charles D. Miller

[57] ABSTRACT

The present invention relates to a simplified apparatus for converting a binary fraction input into a Natural Binary Coded Decimal (8421 code) and subsequently into a decimal output with the proper sign. The invention provides means for selectively shifting and summing the binary fraction to effect a multiplication by ten. An integer portion to the left of a fixed binal point and a remaining fraction portion to the right are produced. The integer portion is extracted as a BCD character which is converted via a nixie display into decimal form. Shifting and summing successive remaining fractions and displaying successive integer portions produces a final decimal number which corresponds to the binary fraction input.

10 Claims, 3 Drawing Figures

FRACTIONAL BINARY TO DECIMAL CONVERTER

BACKGROUND OF THE INVENTION

Because the scientific and business worlds operate in a decimal system while the overwhelming majority of digital computers operate in a binary system (binary logic being cheaper, more reliable, and simpler), many apparatuses and methods have been devised for converting binary fractions to Binary Coded Decimal (BCD) or decimal form. However, these prior art approaches have been complex and have required intricate circuitry in performing the conversion. One such apparatus is outlined in U.S. Pat. No. 3,257,547. The converter therein described includes elegant logic units which successively multiply a fractional binary input by the decimal number ten (1010 in binary form) and then take the four most significant bits resulting from each multiplication process as the next most significant BCD digit of the output. In accomplishing this conversion, the described prior art apparatus executes two cycles, i.e., a shift cycle and a fix-up cycle. In operation, a fractional binary number to be converted is shifted out, one bit each cycle, least significant bit first, into a series of BCD units each having four flip-flops arranged to represent the binary coded decimal digit. During the fix-up cycle, the most significant bit of the four bits which enter each BCD unit is examined and, if it is a binary 1, an appropriate logically-determined number is subtracted from the shifted out number with the result being placed in the four flip-flops in BCD form. By employing these two cycles alternately, a complete binary to BCD conversion is effected in a number of cycles equal to the number of initial binary bits in the binary number.

The described prior art converter requires logic units which operate on the binary fraction in accordance with a series of Boolean equations. For example, according to the Boolean equations, the conversion of 1/16 (.0001 in binary) would include a first step shifting the least significant bit, 1, into the most significant digit flip-flop of a first four-digit BCD unit which reads the resulting BCD number as 8 (1000 in binary). By Boolean methods, the converter "fixes up" the resulting BCD number by subtracting 3 (0011 in binary) from 8 (1000 in binary) to give 5 (0101 in binary) in the most significant BCD unit. At this point in the conversion the BCD units together hold a value .5000 .... The 5 is then shifted to the most significant digit flip-flop of a second, third, and successive units (as more significant bits of the binary fraction word are shifted in) until it ends up in the —5— position. After a number of other logical operations, a final decimal equivalent value of .0625 ... is extracted corresponding to the initial binary .0001 (1/16). The logic units to "fix-up the BCD number and the gating networks, which implement the Boolean equations, greatly complicate the operation of this prior art converter.

SUMMARY OF THE INVENTION

The present invention converts binary number input into decimal outputs in a manner which is simpler and more versatile than that of the prior art, no implemented Boolean logic circuitry being required by the present invention.

In addition, the present invention provides means for determining decimal outputs, with appropriate sign designations, for positive and negative binary inputs.

The present invention also provides "manual" and "automatic" modes for setting the period between decimal readouts for a series of binary inputs.

In its preferred embodiment, the present invention contemplates the conversion of a 24-bit binary fraction into a ten-place decimal which results in a ten-fold increase in accuracy over prior conventional eight-place decimal outputs.

Lastly, the present invention converts binary inputs of fractional form into equivalent decimal outputs, e.g., series of digits, making the conversion especially useful with a digital differential analyzer computer which solves differential equations and performs other analog computations on fractional binary inputs.

DECRIPTION OF THE DRAWINGS

DESCRIPTION OF THE PREFERRED EMBODIMENT

Figure 1A:
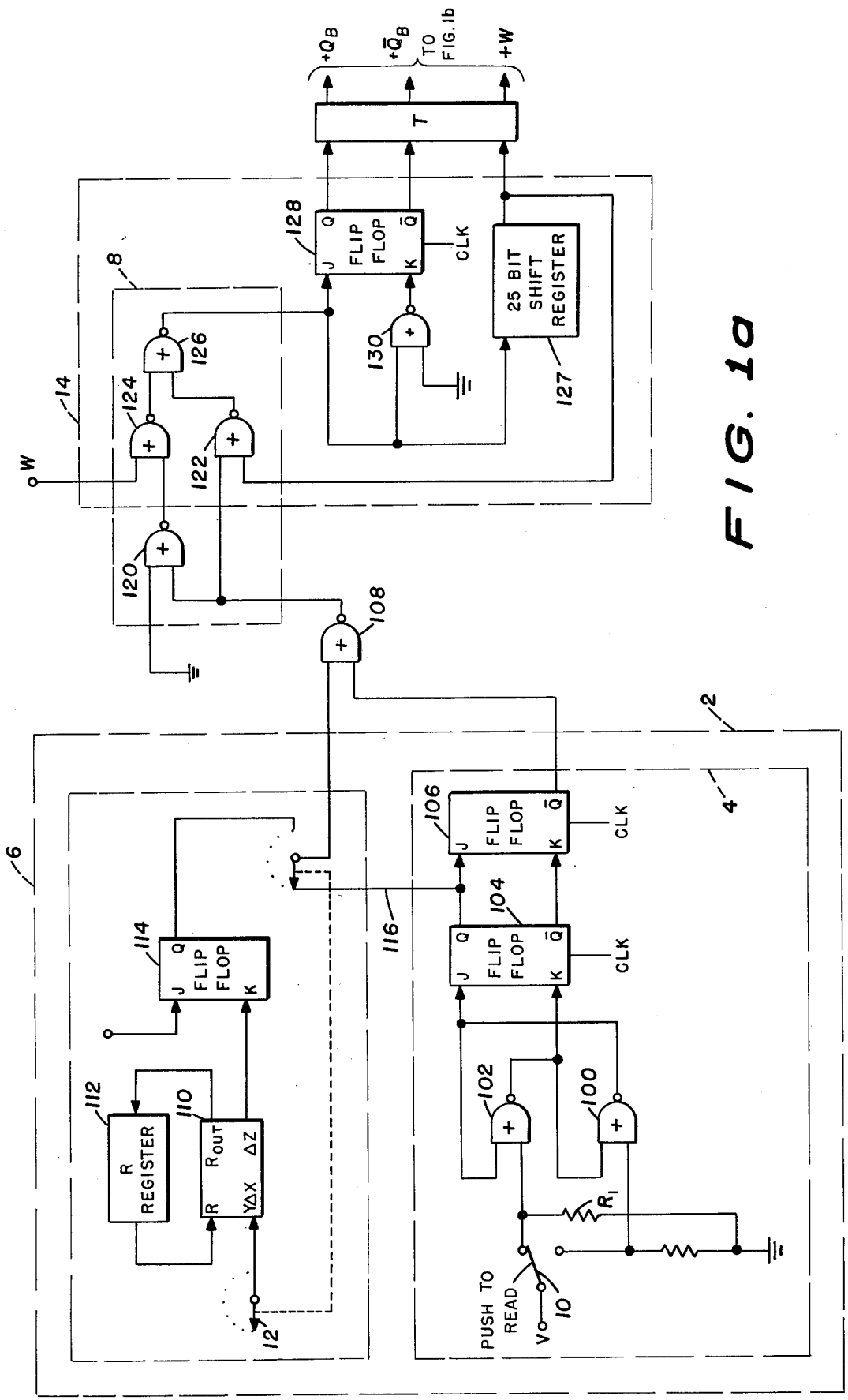
FIGS. 1a and 1b are circuit diagrams which together embody the present invention.
Figure 1B:
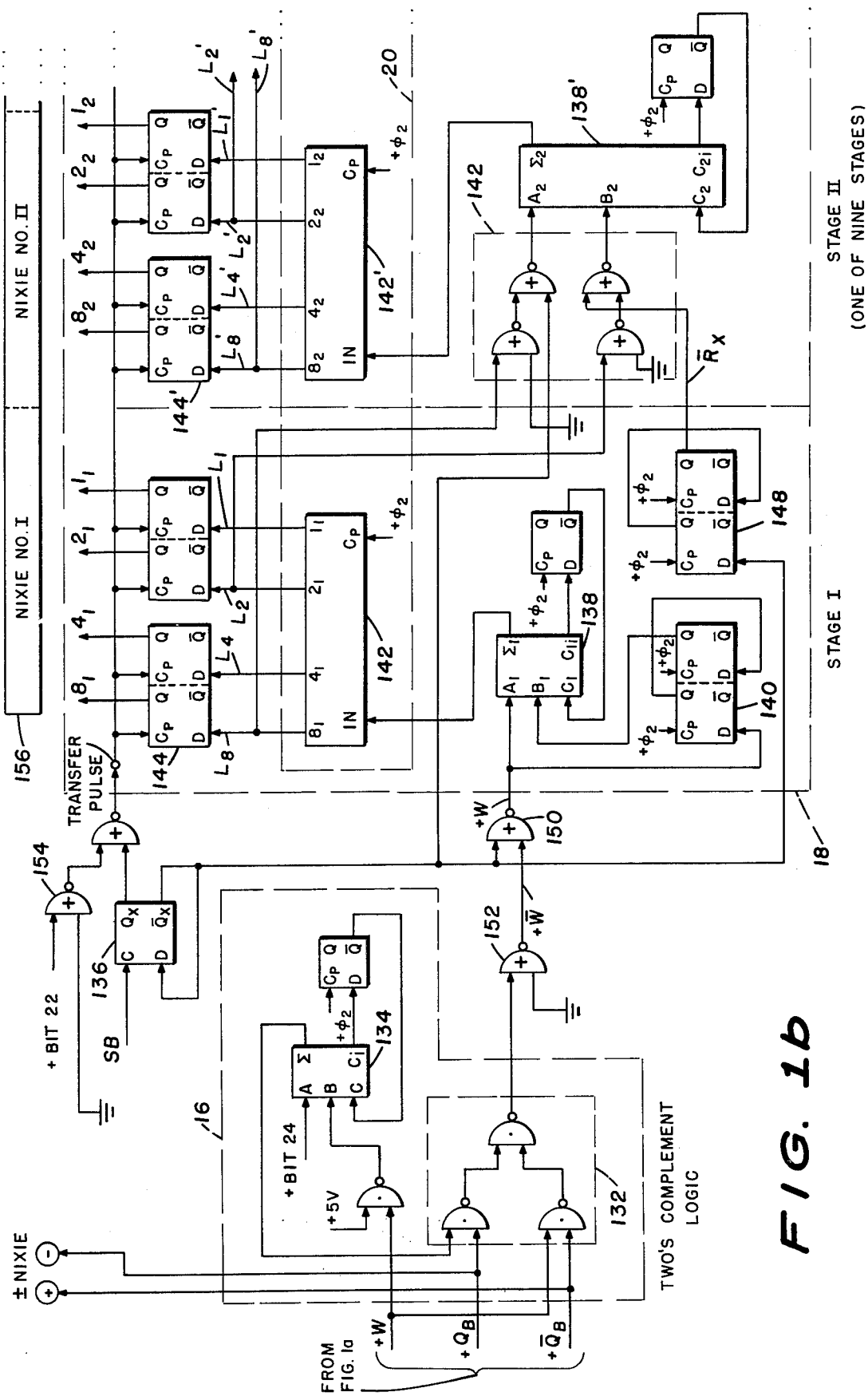

FIGS. 1a and 1b show the preferred embodiment of the present invention comprised of four major elements. The first, read pulse generator 2, is depicted as having two alternate modes: a manual mode with related circuitry 4 and an adjustable mode shown by circuitry 6. In both modes, read pulse generator 2 produces a pulse which designates the time at which a binary number is to be converted. More specifically, the output of pulse generator 2 is gated with a binary fraction word W at NOR gate arrangement 8, permitting binary numbers to be read in only when pulse generator 2 produces a read pulse. Pulses are generated in the manual mode by depressing switch 10; in the adjustable mode pulses are generated periodically and automatically by setting a ring counter 12 to a selected output.

Pulsed-in binary fraction words W enter the next major element, sign determination logic 14, which reads a sign bit SB associated with each binary fraction word W and concludes that the binary number to be converted is positive or negative. If the binary number represented by binary fraction word W is a negative fraction, the word is complemented in logic circuitry 16, the third major element, to produce an "equivalent" positive binary. If the binary number is positive no complementing takes place. The output of logic circuitry 16 in either case enters the final and most important element, multiplier stages 18.

Multiplier stages 18, in effect, multiply the incoming binary fraction word W by ten (1010 in binary), extract an integer portion representing the most significant decimal digit (MSD) therefrom, multiply the remaining fraction portion by ten (1010 in binary), extract the next MSD from the next integer portion and so on until the binary number is represented by decimal digits stored in holding registers 20 of multiplier stages 18. This general method of converting from binary-to-decimal by successively multiplying by ten (1010) is well-known in the art as evidenced by the discussion found in the aforementioned reference U.S. Pat. No. 3,257,547. However, the implementation of that method by the simplified, adaptable circuitry of the present invention, as shall now be more specifically described, represents an innovative departure from prior art binary-to-decimal converters.

Referring again to the first major element, pulse generator 2, manual mode circuitry 4 is shown connected via switch 10 to a voltage source V. (In the preferred embodiment negative logic metal oxide semiconductor/field effect transistor (MOS/FET) components are employed in pulse generator 2 and sign determination logic circuitry 14 because of their compactness and versatility. To be compatible with the MOS/FET negative logic, $V = -14$ volts.) In its normal, undepressed position, switch 10 connects an input of NOR gate 102 to voltage source V (which is hereafter referred to as 1 or high). Output from NOR gate 102 is then 0 (or low) corresponding to ground voltage; NOR gate 100 thus has two 0 (or low) inputs yielding a 1 (or high) output corresponding to V, or $-14$ volts. The outputs from NOR gates 100 and 102 are connected to the J and K leads, respectively, of a conventional J-K flip-flop 104. When switch 10 is in normal position, $J = 1$ and $K = 0$. When switch 10 is depressed, i.e., pushed-to-read (see arrow), $-14$ volts is fed to one input of NOR gate 100 and an input to NOR gate 102 is connected to ground through resistor $R_1$. The output of NOR gate 100 becomes 0 and thus provides a second 0 input to NOR gate 102. The output from NOR gate 102 is 1; J is then 0 and K is 1. The Q and $\overline{Q}$ outputs of J-K flip-flop 104 feed into a second J-K flip-flop 106. As seen in FIG. 1a, the Q output of flip-flop 104 is connected to the J lead of flip-flop 106 and the $\overline{Q}$ output feeds the K lead of flip-flop 106. Flip-flops 104 and 106 are clocked at sign-bit (SB) time by clock CLK. In accordance with conventional J-K flip-flop logic, the $\overline{Q}$ output of flip-flop 106 will turn ON to the 1 state when the second sign-bit time is clocked after depressing switch 10. That is, at the first clock pulse from clock CLK flip-flop 104 changes state to turn ON Q of flip-flop 104; $\overline{Q}$ of flip-flop 106 remains at 0, however, until, at the second bit-time, a pulse is generated which causes flip-flop 106 to change state. $\overline{Q}$ of flip-flop 106 is connected as an input to NOR gate 108. When $\overline{Q}$ of flip-flop 106 is 0 during the first sign-bit time and Q of flip-flop 104 is also 0 (i.e., the 1 input at K of flip-flop 104 has set the Q output of flip-flop 104 to 0), it can be seen from FIG. 1a that NOR gate 108 has two 0 inputs. A pulse output of 1 on NOR gate 108 results. This pulse represents the read pulse generated by the manual mode circuitry 4 of read pulse generator 2.

A second input to NOR gate 108 comes from adjustable mode circuitry 6. The adjustable mode provides a conventional ring counter 12 which determines the value of the scale factor $Y\Delta X$ of R Adder 110. Scale factor $Y\Delta X$ is added to whatever input may be stored (as an initial value) in R Adder 110, the sum of which is shown as $R_{OUT}$. The sum at $R_{OUT}$ is fed into R Register 112 which transfers the sum back into R Adder 110 at input $R_{IN}$. From then on $R_{IN}$ is periodically incremented by scaling factor $Y\Delta X$ and circulated through R Register 112 until R Adder 110 is "full". The next increment causes an overflow (or carry) at output $\Delta Z$ which feeds the K input of J-K flip-flop 114. Depending on the position at which ring counter 112 is set, the contents of R Adder 110 can be incremented by an amount corresponding to from 64msec to 65 secs.

The J lead of flip-flop 114 is always high. Before overflow, $J = 1$ and $K = 0$; Q of flip-flop 114 is accordingly 1. The $Q = 1$ value is fed to NOR gate 108, causing a 0 (no pulse) output. When overflow at output $\Delta Z$ changes K to a 1 state (J still being 1), Q of flip-flop 114 changes state to 0. Now at NOR gate 108 there are two 0 inputs which generate a read pulse output.

Lead 116 is provided to prevent simultaneous operation of the manual and adjustable modes and also to cause a pulse to be generated via NOR gate 108 when Q of flip-flop 104 and $\overline{Q}$ of flip-flop 106 are both 0.

The two 0 inputs to NOR gate 108 yield a pulse output which enters NOR gates 120 and 122. With a high input to each of these NOR gates 120 and 122, the outputs of both NOR gates 120 and 122 must be low ("0"). The 0 state of NOR gate 120 is then NORed with binary fraction word W in NOR gate 124. The 0 output of NOR gate 122 is then NORed with the output of NOR gate 124 in NOR gate 126 to effect a "reading in" of binary fraction word W. Binary fraction word W is then fed into a shift register 127. The contents of shift register 127 are circulated through NOR gates 122 and 126. It should, however, be noted that the contents are circulated only when the output of NOR gate 108 is in 0 state; that is, when no read pulse is being generated. Output from NOR gate 126 (of gating arrangement 8) enters a J-K flip-flop 128 which is clocked at sign-bit (SB) time.

If the sign-bit (generated at sign-bit time) is 1 indicating a negative binary number, the J input to flip-flop 128 is at 1 state and the K input to flip-flop 128 is made 0; $\overline{Q}_B$ then is turned to the 1 used to drive the minus input of the $\pm$ Nixie. Conversely, if the sign bit is 0, $J = 0$ and $K = 1$ via NOR gate 130; $\overline{Q}_B$ is then turned to the 1 state thereby corresponding to a positive binary number. The signals representing binary fraction word W and outputs $Q_B$ and $\overline{Q}_B$ from sign-bit determination logic 14 are translated by conventional translator T into positive Transistor-Transistor Logic (TTL) which is notably faster and more adaptive to repetitive and cyclic operations. The translated signals then enter major element 16 (see FIG. 1b), the two's complement logic element. If $Q_B$ is in the 1 state, the binary fraction word W passes through NAND gate network 132 unaltered. However, if $\overline{Q}_B$ is in the 1 state indicating a negative binary number, the two's complement of the binary fraction word W is generated in full adder 134. The complemented and passed through words W's are then treated identically as checked words + W's. The two's complement circuitry can, of course, be substituted by one's complement logic at the expense of introducing an error in the least significant bit which may be considerable where small numbers are being converted. The preferred embodiment performs the conversion in the conventional two's complement manner to achieve minimum error.

Still referring to FIG. 1b, checked word +W is clocked by sign-bit flip-flop 136 into multiplier stages 18. Simultaneously, checked word +W enters state I through the $A_1$ input of a full adder 138 and the D input of a two-bit shift register 140. Two-bit shift register 140 produces an output which is the checked word +W shifted two bits (toward higher significance) with a clock pulse $\phi_2$; this shifting representing a X4 multiplication. The Q output from shift register 140 enters full adder 138 at the $B_1$ input. The $A_1$ and $B_1$ inputs are added together with carry input $C_1$ in full adder 138 thereby producing an overall effect of a X5 multiplication at the $\Sigma_1$ output. The $\Sigma_1$ output is delayed, or shifted by one bit (in the direction of higher significance) which effects a X2 multiplication of $\Sigma_1$ (or an overall X10 multiplication of the checked word +W). This delay (multiplication by two) is performed by shift register 142 which transfers its shifted contents, via lines L8, L4, L2, and L1, to four corresponding type D flip-flops 144. The contents of the four type D flip-flops 144 represent an integer code which can be read, by means of a nixie tube, as the most significant digit (MSD) of the decimal sought. Lines L2 and L8 of stage I are also connected via NOR circuitry 146 to effect a X10 multiplication of the remaining fraction code, i.e., the bits remaining after the integer code is extracted, to be fed into stage II. As seen in FIG. 1b, L8 is logically combined with the $\overline{Q}_x$ output of type D flip-flop 136 to feed full adder 138' at input $A_2$; L2 is logically combined with $R_x$ which is simply $\overline{Q}_x$ shifted (or delayed) two bits by type D flip-flop 148. The output from logically combining L2 and $\overline{R}_x$ enters full adder 138' at input $B_2$ where it is added to $A_2$ to yield $\Sigma_2$. $B_2$ represents X4 multiplication (two-bit shift) of the remaining fraction code. Adding the inputs at $B_2$ to those at $A_2$ (together with carry input $C_2$) according to standard full adder logic yields a X5 multiplication of the remaining fraction code at output $\Sigma_2$. The output at $\Sigma_2$ is then delayed one bit in shift register 142' to effect a X2 multiplication as in stage I. The output from shift register 142' represents the remaining fraction code emanating from stage I after a X10 (or 1010 in binary) multiplication. As in stage I, an integer code (to be entered into flip-flops 144') and a remaining fraction code are generated; the integer code representing the next MSD and the remaining fraction code being carried on L2' and L8' to stage III to determine the next BCD digit. Successive integer codes are extracted by (in the preferred embodiment) ten successive stages, thereby yielding a ten-place BCD decimal representation of a 24 bit binary fraction. At bit-22 time, type D flip-flops 144, 144', and the type D flip-flops associated with the succeeding stages are pulsed by a transfer pulse which occurs when $\overline{Q}_x$ of flip-flop 136 is 1. $\overline{Q}_x$, it should also be noted, feeds NOR gate 150 along with the complement (produced by NOR gate 152) of the checked word +W, i.e., $+\overline{W}$. The inputs to NOR gate 152 permit a checked word +W to enter multiplier stages 18 only when $\overline{Q}_x$ of flip-flop 136 is 0. Thus, during the word time when $\overline{Q}_x$ is 0 a checked word +W enters multiplier stages 18 to be converted while during the next word time ($\overline{Q}_x = 1$) no check word is sent through to multiplier stages 18. Instead the transfer pulse is passed through NOR gate 154 to transfer the BCD decimal outputs in flip-flops 114, 114', et seq. to the ten nixie tubes 156 of the display.

Figure 2:
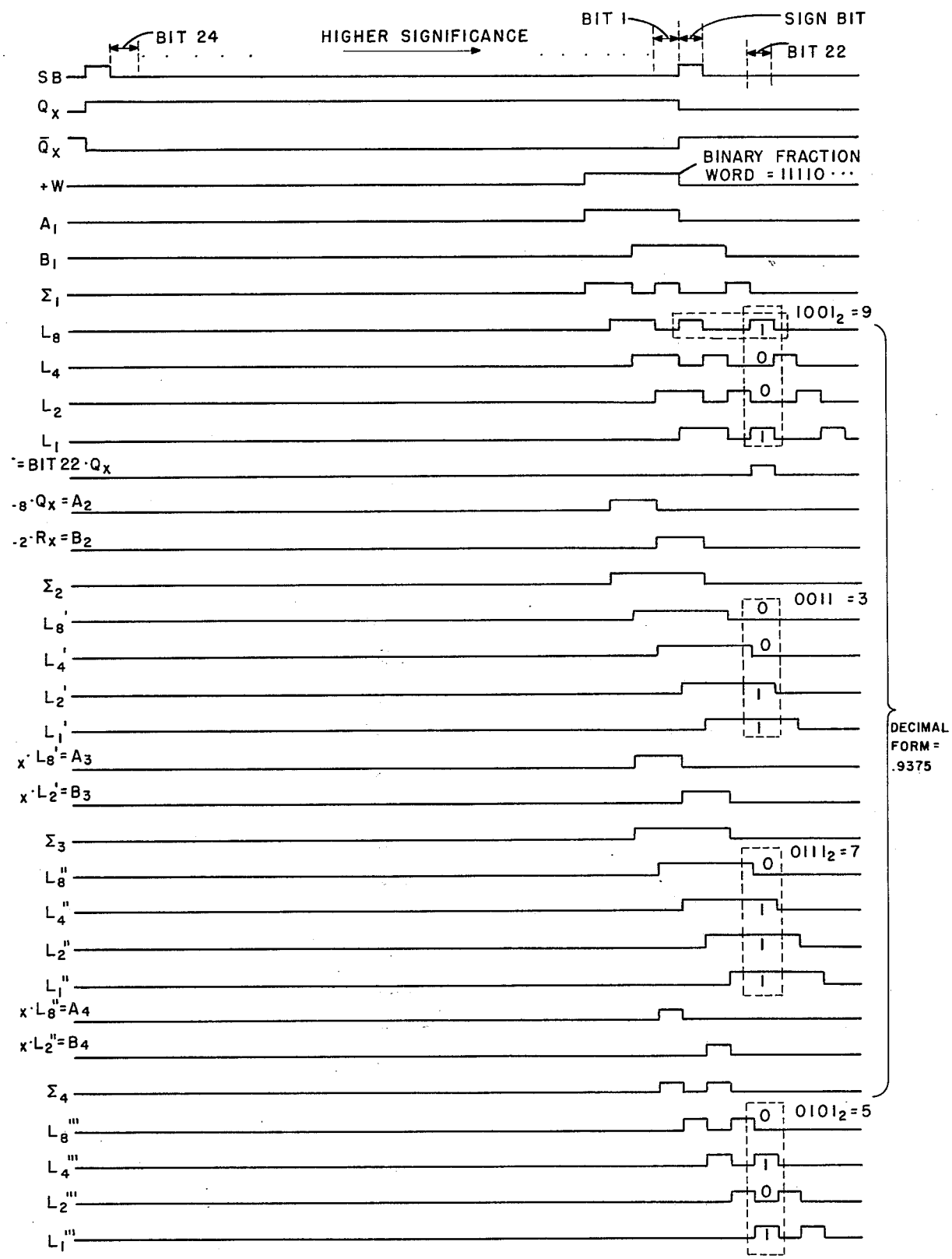
FIG. 2 is a timing diagram showing the operation of the present invention.

Reference in now made to FIG. 2 which illustrates, in timing diagram form, the operation of the hardware of the present invention. The sign-bit SB line indicates the sign-bit time which occurs at the twenty-fifth bit-time of each word. SB (in FIG. 1b) is shown clocking type D flip-flop 136 causing $Q_x$ and $\overline{Q}_x$ to pulse alternately between SB pulses (during alternate word-times). With $\overline{Q}_x$ in 0 state, checked word +W is passed through NOR gate 150 to multiplier stages 18 as shown in FIG. 1a. Referring again to FIG. 2 checked word +W is shown by way of example, to be +.1111 (in binary) or 15/16 (= .9375). In the preferred embodiment, of course, there would be twenty 0's following the +.1111. However, for simplicity the present example will be limited to 4 binary places. The input to $A_1$ is simply +W, while that to $B_1$ shown immediately below $A_1$ is simply +W delayed (or shifted in the direction of higher significance) by two bit-times. Adding lines $A_1$ to $B_1$ gives sum $\Sigma_1$. $\Sigma_1$ represents the binary value after a X5 multiplication of checked word +W. L8 shows $\Sigma_1$ shifted (or delayed) one bit; L4 shows $\Sigma_1$ shifted two bits; L2 shows $\Sigma_1$ shifted three bits; and L1 shows $\Sigma_1$ shifted four bits. Reading the L8 through L1 lines at bit-22 time yields an output equal to 1001 (or 9 in decimal). It should, of course, be noted that the L8 through L1 bits at bit-22 time are equivalent to the four bits of L8 starting at bit-time 22 and reading through bit-time 25 as indicated in FIG. 2. In either case, this binary represents the MSD of the decimal sought.

To obtain the next MSD, L8 is effectively ANDED with $Q_x$ in NOR circuitry 146 (of FIG. 1b) to provide an input at $A_2$ comprising the remaining fraction code while L2 is effectively ANDED in NOR circuitry 146 to provide an input at $B_2$. By effectively ANDing L8 with $Q_x$ and L2 with $R_x$ (in the Figures, $\overline{Q}_x$ and $\overline{R}_x$ are inverted in the gating operations) the integer code extracted by stage I is suppressed permitting only the remaining fraction code to pass on to stage II. A X5 multiplication is effected at $\Sigma_2$ summing $A_2$ and $B_2$ in full adder 138'. Again, as in stage I, $\Sigma_2$ can be successively delayed by one bit to yield L8', by two bits to yield L4', by three bits to yield L2', and finally four bits to yield L1' as shown in FIG. 2. Reading the L8' through L1' outputs together (at bit-time 22) as the integer portion representing the next MSD, 0011 (or 3 in decimal) results.

The third, fourth (and later) MSDs are generated in a manner identical to the manner described for obtaining the second MSD except that the subscripts and prime labels are changed accordingly (see FIG. 2). The fourth MSD, for example, will AND L8'' with $Q_x$ (to give $A_4$) and L2'' with $R_x$ (to give $B_4$). Adding $A_4$ with $B_4$ to give $\Sigma_4$ and then successively delaying $\Sigma_4$ to produce L8''', L4''', L2''', and L1''', the fourth MSD can be found by reading the L8''' through L1''' outputs together (at bit-22 time) as previously described.

Evaluating the values of the unprimed and primed values of the L8 through L1 outputs at bit-22 time as seen in FIG. 2 indicates the MSD is 1001, or 9 (as aforestated); the second MSD is 0011, or 3; the third MSD is 0111, or 7; and the fourth MSD is 0101, or 5. The decimal number produced by the converter is then 9375 . . . . Placing a decimal point before the number yields the decimal output of .9375 (or 15/16) which corresponds to the binary input .1111.

Obviously, various modifications, adaptations and alterations are possible in light of the above teachings without in any manner departing from the spirit or scope of the present invention, as defined in the appended claims.

What is claimed is:

1. An apparatus for converting an $n$-bit binary fraction word into a word in decimal form comprising:
    a read-in line on which the $n$ bits of a binary fraction word are carried,
    means for generating a word pulse during the $n$ bits of alternating word-times,
    means connected to the word pulse generator for shifting the word pulse two bits in the direction of higher significance, thereby generating a shifted pulse,
    a first stage having the binary fraction word on the read-in line as an input,
    a series of successive stages, connected to and in seriatim following the first stage, each successive stage having as an input a remaining binary fraction generated by its preceding stage, wherein the first stage and each successive stage comprises:

means for ANDING the input of each stage with the generated word pulse from the word-pulse generating means thereby producing a first gate input, means for shifting the input two bits in the direction of higher significance, thereby generating a shifted input, means for ANDing the shifted input of each stage with the shifted word pulse, thereby producing a second gate-input, means for summing the first gate-input and the second gate-input thereby producing a summed output, means for shifting the summed output two bits in the direction of higher significance, thereby generating the input for the next successive stage, and means for grouping together the four most significant bits of each generated input as a binary-coded decimal, and means for ordering the binary-coded decimals in decreasing significance for successive stages.

2. An apparatus as defined in claim 1, further comprising: a read pulse generator for generating a pulse which controls the time at which a binary fraction word carried on the read-in line is to be converted.

3. An apparatus as defined in claim 2 wherein said read pulse generator comprises:
manual mode circuitry,
automatic adjustable mode circuitry, and
means for selectively switching to either mode.

4. An apparatus as defined in claim 3, wherein the automatic adjustable mode circuitry comprises:
a ring counter for determining a base time interval and
an R adder connected to the ring counter for determining how many base time intervals must pass before a read pulse is generated.

5. An apparatus as defined in claim 1 further comprising: sign determination logic circuitry, having the binary fraction word on the read-in line as an input, for determining the sign of the binary fraction word,
means, receiving the output of the sign determination logic circuitry, for complementing negative binary fraction words and for selectively passing through positive and complemented negative binary traction words to the first stage, and
sign bit output indicator means connected to the output of the sign bit determination logic circuitry for indicating the sign of the converted decimal form word.

6. An apparatus as defined in claim 5 wherein the sign determination logic circuitry comprises negative logic circuitry and the complementing and pass through means comprises positive TTL circuitry and wherein a translator is interposed between the logic circuitry and the TTL circuitry for making the logic circuitry and TTL circuitry compatible.

7. An apparatus as defined in claim 5, further comprising: a display which receives the binary-coded decimals from the ordering means for indicating in decimal form the binary-coded decimals generated in the successive stages.

8. An apparatus as defined in claim 5, where $n$ equals 25, further comprising:
a 25 bit register for storing bits read in from the read-in line and
gate circuitry means for connecting the 25 bit register to the word pulse generator, such that the 25 bits in the register are converted only when a word pulse is generated.

9. An apparatus as defined in claim 8 which includes nine successive stages, further comprisng:
10 decimal display indicators, connected to the binary-coded decimal ordering means, for displaying the binary-coded decimals generated by the stages in 10-digit decimal form.

10. An apparatus as defined in claim 8, wherein the means for grouping together the 4 most significant bits of each generated input comprises:
a shift register, having the generated input as an input, for producing four outputs equivalent to the generated input shifted 0, 1, 2, and 3 bits, respectively, in the direction of higher significance, and
means, connected to the shift register, for reading off the binary value of the 0-, 1-, 2- and 3-bit shifted outputs at the fourth least significant bit-time of the previous word-time.

* * * * *